United States Patent [19]

Giebel

[11] Patent Number: 4,922,139
[45] Date of Patent: May 1, 1990

[54] FILTER CIRCUIT FOR GENERATING A VCO CONTROL VOLTAGE RESPONSIVE TO THE OUTPUT SIGNALS FROM A FREQUENCY/PHASE DISCRIMINATOR

[75] Inventor: Burkhard Giebel, Denzlingen, Fed. Rep. of Germany

[73] Assignee: Deutsche ITT Industries GmbH, Freiburg, Fed. Rep. of Germany

[21] Appl. No.: 312,263

[22] Filed: Feb. 21, 1989

[30] Foreign Application Priority Data

Mar. 30, 1988 [EP] European Pat. Off. ............ 88105166

[51] Int. Cl.$^5$ .......................... H03K 5/00; H03B 1/00
[52] U.S. Cl. ..................................... 307/520; 307/514; 307/246; 328/133; 328/167
[58] Field of Search ....................... 328/111, 133, 167; 331/17; 307/448, 451, 453, 520, 521, 511, 514, 236, 246

[56] References Cited

U.S. PATENT DOCUMENTS

| | | | |
|---|---|---|---|
| 4,291,274 | 9/1981 | Suzuki et al. ...................... | 328/133 |
| 4,316,150 | 2/1982 | Crosby ............................... | 307/511 |
| 4,774,479 | 9/1988 | Tateighi . | |

FOREIGN PATENT DOCUMENTS 2627701 12/1977 Fed. Rep. of Germany .
8202987 9/1982 World Int. Prop. O. .

OTHER PUBLICATIONS

Deog-Kyoon Jeong, et al., "Design of PLL-Based Clock Generation Circuits," IEEE Journal of Solid-State Circuits, vol. Sc-22, No. 2, Apr. 1987, pp. 255-261.

*Primary Examiner*—Stanley D. Miller
*Assistant Examiner*—Timothy P. Callahan
*Attorney, Agent, or Firm*—Thomas L. Peterson

[57] ABSTRACT

A filter circuit is driven by two digital phase responsive output signals from the frequency/phase discriminator of a phase-locked loop (PLL) circuit. The controlled current paths of a first n-conducting transistor, a second n-conducting transistor, a second p-conducting transistor and a first p-conducting transistor are connected in that order between the plus and minus poles of a source of supply voltage. The common connection between the controlled current paths of the second n-conducting transistor and the second p-conducting transistor is connected to the output of the filter circuit. The second n-conducting transistor and the second p-conducting transistor are connected as diodes with the gate of the second n-conducting transistor connected to the common connection between the first n-conducting transistor and the second n-conducting transistor, and with the gate of the second p-conducting transistor connected to the common connection between the first p-conducting transistor and the second p-conducting transistor. The output of the filter circuit is connected across a series RC circuit to the minus pole of the source of supply voltage. The first digital signal from the frequency/phase discriminator is fed to the gate of the second n-conducting transistor via a capacitor. The second digital signal from the frequency/phase discriminator is fed to the gate of the second p-conducting transistor via the series arrangement of an inverter and a capacitor. The gate of the first n-conducting transistor and the gate of the first p-conducting transistor are applied to the common connection of the resistor and the capacitor of the RC circuit. In that way the range of control of the output voltage from the filter circuit is substantially greater than that of the supply voltage, and the coupling-in of the two digital signals to the output voltage is substantially avoided.

6 Claims, 1 Drawing Sheet

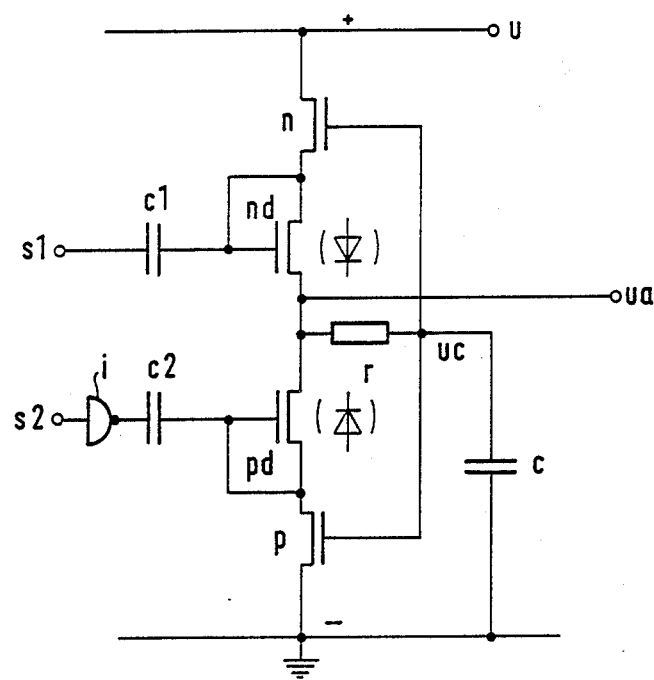

FILTER CIRCUIT FOR GENERATING A VCO CONTROL VOLTAGE RESPONSIVE TO THE OUTPUT SIGNALS FROM A FREQUENCY/PHASE DISCRIMINATOR

BACKGROUND OF THE INVENTION

1. Field of the Invention

The present invention relates to a filter circuit for a digital phase-locked loop (PLL) circuit having a digital frequency/phase discriminator which provides two digital signals, and, in particular, to a filter circuit which receives the two digital signals from the digital frequency/phase discriminator and provides a smoothed voltage output for controlling a voltage-controlled oscillator.

2. Description of the Related Art

With regard to the stated practical application, a simple CMOS filter circuit for a phase-locked loop circuit is explained in Deog-Kyoon Jeong, et al., "Design of PLL-Based Clock Generation Circuits," *IEEE Journal of Solid-State Circuits*, Vol. SC-22, No. 2, April 1987, pp. 255–261. Particular reference is made to FIG. 3b on page 256 of the article, which shows a circuit comprising the series arrangement of the controlled current paths of a p-conducting transistor and an n-conducting transistor. The series arrangement is disposed between the two poles of a source of supply voltage. A square-wave (i.e., digital pulse) signal from a frequency/phase discriminator is fed to one or the other of the two gates serving as the control terminals of the two transistors. The common connecting point between the two transistors is connected via a series RC circuit to one pole of the source of supply voltage. A smooth voltage is taken off this connecting point, across a series resistor. The smoothed voltage is then fed to the control input of the voltage-controlled oscillator (VCO) of the PLL circuit. The two digital signals that control the two transistors are the UP signal and the DOWN signal generated by the frequency/phase discriminator in response to whether the phase of the output of the VCO leads or lags the phase of a reference signal.

The filter circuit as described hereinbefore has, among other disadvantages, the disadvantage that the digital signals are transmitted via parasitic capacitances between the gate and the source/drain of the two transistors to the output. Also, the output voltage (ua) is restricted to the range lying between the magnitude of the control terminal threshold voltage ($u_{tn}$) of the n-conducting transistor and the supply voltage (u) as reduced by the magnitude of the control terminal threshold voltage ($u_{tp}$):

$$ua = u - |u_{tp}| - |u_{tn}|.$$

SUMMARY OF THE INVENTION

The above described disadvantages associated with the previous invention are remedied by the invention as described herein, in that the coupling of the two digital input signal voltages to the output voltage of the filter circuit is substantially avoided, and further in that the output voltage range is enlarged.

BRIEF DESCRIPTION OF THE DRAWING

The invention will now be explained in greater detail with reference to the accompanying single drawing figure which shows the circuit diagram of a preferred embodiment of the filter circuit of the present invention, as realized in CMOS technology.

DETAILED DESCRIPTION OF THE PREFERRED EMBODIMENT

In the drawing, a source of supply voltage u having a plus pole + and a minus pole − is connected to the filter circuit of the present invention. The minus pole − of the source of supply voltage u is connected to a ground reference, as indicated. The filter circuit comprises the series arrangement of the controlled current paths of a first n-conducting transistor n, a second n-conducting transistor nd, a first p-conducting transistor p, and a second p-conducting transistor pd. The current paths of the four transistors are connected between the plus pole + and the minus pole − of the supply voltage u with the current path of the of the first n-conducting transistor n connected to the plus pole +, followed in order by the current path of the second n-conducting transistor nd, the current path of the second p-conducting transistor pd and the current path of the first p-conducting transistor p, with the latter current path being connected to the minus pole − of the supply voltage u.

The second n-conducting transistor nd is connected as a diode in that the control terminal (i.e., gate) of the second n-conducting transistor nd is connected to the point connecting the current path of the second n-conducting transistor nd to the current path of the first n-conducting transistor n. Similarly, the second p-conducting transistor pd is connected as a diode in that the control terminal (i.e., gate) of the second p-conducting transistor pd is connected to the point connecting the current path of the second p-conducting transistor pd to the current path of the first p-conducting transistor p. Thus, the second n-conducting transistor nd and the second p-conducting transistor pd represent resistance-affected diodes.

The control terminal (i.e., gate) of the second n-conducting transistor nd (which is connected as a diode) is supplied with a first square-wave (i.e., digital pulse) signal s1 via a first capacitor c1. The control terminal (i.e., gate) of the second p-conducting transistor pd (which is connected as a diode) is supplied with a second square-wave (i.e., digital pulse) signal s2 via both an inverter i and a second capacitor c2. The first digital signal s1 and the second digital signal s2 are the UP and DOWN signal outputs of the frequency/phase discriminator (not shown), such as is described in the Jeong, et al., article discussed above.

The point connecting the current paths of the second n-conducting transistor nd and the second p-conducting transistor pd is the output for a smoothed output voltage ua. One terminal of a series RC circuit, comprising a resistor r and a capacitor c, is connected to this point. A second terminal of the series RC circuit is connected to the minus pole − of the source of supply voltage (i.e., connected to the ground reference). A common point connecting the resistor r to the capacitor c of the RC circuit is connected to the control terminals (i.e., the gates) of the first n-conducting transistor n and the first p-conducting transistor p. The voltage at this common point is designated as uc.

The voltage at the gate of the second n-conducting transistor nd has a magnitude of $uc - u_{tn}$, where uc is the voltage at the common point of the resistor r and the capacitor c in the series RC circuit, and where $u_{tn}$ is the control terminal threshold voltage of the first n-conducting transistor n. The voltage at the gate of the second p-conducting transistor pd has a magnitude of uc−−$|u_{tp}|$, where $u_{tp}$ is the control terminal threshold voltage of the first p-conducting transistor p. The diode-connected transistors nd and pd are equivalent to diodes in series with the ON resistance of the transistors.

If, thereafter, for example, the first digital signal s1 assumes an H-level (i.e., high logic level), which is transmitted via the capacitor c1 to the second n-conducting transistor nd, then the capacitor c1 discharges via the second n-conducting transistor nd toward the output voltage ua and further, across the resistor r, to the capacitor c. Inversely, the second digital signal s2 acts through the inverter i and the capacitor c2 via the second p-conducting transistor pd upon the RC circuit and, consequently, upon the output ua, in the same way as has already been explained in the above-cited prior art publication with regard to the simple circuit shown and described therein.

In the circuit according to the present invention, the range of modulation is greater than with the prior art circuit described hereinbefore, because, for example, the capacitor c1 can be pre-charged by the first n-conducting transistor n up to the voltage +u. Thus, the output voltage ua theoretically reaches a maximum value $u+(u-2u_{tn})$. In a comparable way, the output voltage theoretically reaches a minimum voltage value $-(u-2|u_{tp}|)$. The just mentioned maximum and minimum values relating to the output voltage ua represent the respective theoretical upper and lower limits which, however, are not reached in practice. Thus, for instance, with the exemplary embodiment, as realized in CMOS technology, the substrate control effect of the employed MOS transistors, the ohmic voltage drop at the diode-connected transistors nd, pd, and the opening of the source-drain substrate diode of the transistors pd, nd are responsible for the fact that the maximum possible range of variation of the output voltage ua is not reached. However, the range is still substantially greater than with the prior art circuit, as described hereinbefore.

It is within the scope of the invention to employ complementary bipolar transistors instead of the CMOS transistors used in the exemplary embodiment shown in the accompanying drawing. Likewise, the diode-connected transistors nd, pd may be replaced by the series connection of a resistor and a diode.

What is claimed is:

1. A filter circuit for a digital phase-locked loop (PLL) circuit, said filter circuit receiving first and second digital signals from a digital frequency/phase discriminator responsive to the phase relationship between two periodic input signals applied to said digital frequency/phase discriminator, said filter circuit providing a smoothed output voltage on an output terminal for controlling a voltage controlled oscillator, said filter circuit comprising:

a first n-conducting transistor having a control terminal and a current path controlled by said control terminal, said controlled current path having first and second ends, said first end of said controlled current path of said first n-conducting transistor connected to the plus pole of a source of supply voltage;

a first p-conducting transistor having a control terminal and a current path controlled by said control terminal, said controlled current path having first and second ends, said second end of said controlled current path of said first p-conducting transistor connected to the minus pole of said source of supply voltage;

a second n-conducting transistor having a control terminal and a current path controlled by said control terminal, said controlled current path having first and second ends, said first end of said controlled current path of said second n-conducting transistor connected to said second end of said controlled current path of said first n-conducting transistor, said second end of said controlled current path of said second n-conducting transistor connected to said output terminal of said filter circuit, said control terminal of said second n-conducting transistor connected to said second end of said controlled current path of said first n-conducting transistor and to said first end of said controlled current path of said second n-conducting transistor so that said second n-conducting transistor operates as a diode;

a second p-conducting transistor having a control terminal and a current path controlled by said control terminal, said controlled current path having first and second ends, said second end of said controlled current path of said second p-conducting transistor connected to said first end of said controlled current path of said first p-conducting transistor, said first end of said controlled current path of said second p-conducting transistor connected to said output terminal of said filter circuit, said control terminal of said second p-conducting transistor connected to said first end of said controlled current path of said first p-conducting transistor and to said second end of said controlled current path of said second p-conducting transistor so that said second p-conducting transistor operates as a diode;

a series RC circuit comprising a resistor and a capacitor each having respective first and second terminals, said first terminal of said resistor connected to said output terminal of said filter circuit, said second terminal of said resistor connected to said first terminal of said capacitor, said second terminal of said capacitor connected to said minus pole of said source of supply voltage, said second terminal of said resistor and said first terminal of said capacitor connected to said control terminals of said first n-conducting transistor and said first p-conducting transistor;

a first input terminal for receiving said first digital signal from said frequency/phase discriminator indicative of a first phase relationship between said periodic input signals applied to said frequency/phase discriminator;

a second input terminal for receiving a second digital signal from said frequency/phase discriminator indicative of a second phase relationship between said periodic input signals applied to said frequency/phase discriminator;

a capacitor connected between said first input terminal and said control terminal of said second n-conducting transistor to provide a signal responsive to said first digital signal to said control terminal of said second n-conducting transistor, said second n-conducting transistor conducting current to increase the voltage on said output terminal of said filter circuit in response to said first phase relationship; and an inverter and a capacitor connected in series between said second input terminal and said control terminal of said second p-conducting transistor to provide a signal responsive to said second digital signal to said control terminal of said second p-conducting transistor, said second p-conducting transistor conducting current to decrease the voltage on said output terminal of said filter circuit in response to said second phase relationship.

2. A filter circuit for a digital phase-locked loop (PLL) circuit, said filter circuit receiving first and second digital signals from a digital frequency/phase discriminator responsive to the phase relationship between two periodic input signals applied to said digital frequency/phase discriminator, said filter circuit providing a smoothed output voltage on an output terminal for controlling a voltage controlled oscillator, said filter circuit comprising:

a first transistor having a control terminal and a current path controlled by said control terminal, said controlled current path having first and second ends, said first end of said controlled current path of said first transistor connected to a source of a positive supply voltage;

a second transistor having a control terminal and a current path controlled by said control terminal, said controlled current path having first and second ends, said second end of said controlled current path of said first transistor connected to a reference voltage that is negative with respect to said positive supply voltage;

a first diode-resistance circuit connected between said first transistor and said output terminal of said filter circuit;

a second diode-resistance circuit connected between said second transistor and said output terminal of said filter circuit;

a series RC circuit comprising a resistor and a capacitor each having respective first and second terminals, said first terminal of said resistor connected to said output terminal of said filter circuit, said second terminal of said resistor connected to said first terminal of said capacitor, said second terminal of said capacitor connected to said minus pole of said source of supply voltage, said second terminal of said resistor and said first terminal of said capacitor connected to said control terminals of said first transistor and said second transistor;

a first input terminal for receiving said first digital signal from said frequency/phase discriminator indicative of a first phase relationship between said periodic input signals to said frequency/phase discriminator;

a second input terminal for receiving said second digital signal from said frequency/phase discriminator indicative of a second phase relationship between said periodic input signals to said frequency/phase discriminator;

a first coupling capacitor connected between said first input terminal and said first diode-resistance circuit, said first coupling capacitor and said first diode-resistance circuit coupling said first digital signal to said output terminal of said filter circuit to increase said output voltage in response to said first phase relationship; and a second coupling capacitor connected between said second input terminal and said second diode-resistance circuit, said second coupling capacitor and said second diode-resistance circuit coupling said second digital signal to said output terminal of said filter circuit to decrease said output voltage in response to said second phase relationship.

3. The filter circuit as defined in claim 2, wherein said first diode resistance circuit is an n-conducting transistor having a control terminal and a current path having first and second ends, said control terminal being connected to one of said first and second ends to cause said n-conducting transistor to operate as a diode in series with the on resistance of said n-conducting transistor.

4. The filter circuit as defined in claim 2, wherein said second diode resistance circuit is a p-conducting transistor having a control terminal and a current path having first and second ends, said control terminal being connected to one of said first and second ends to cause said p-conducting transistor to operate as a diode in series with the on resistance of said p-conducting transistor.

5. The filter circuit as defined in claim 2, wherein said first transistor is an n-conducting transistor.

6. The filter circuit as defined in claim 2, wherein said second transistor is a p-conducting transistor.

* * * * *